United States Patent
Ahn et al.

(10) Patent No.: US 9,466,636 B2
(45) Date of Patent: Oct. 11, 2016

(54) IMAGE SENSORS INCLUDING WELL REGIONS OF DIFFERENT CONCENTRATIONS AND METHODS OF FABRICATING THE SAME

(71) Applicant: Samsung Electronics Co., Ltd., Suwon-si, Gyeonggi-do (KR)

(72) Inventors: Jungchak Ahn, Yongin-si (KR); Yitae Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/807,992

(22) Filed: Jul. 24, 2015

(65) Prior Publication Data
US 2015/0333100 A1    Nov. 19, 2015

Related U.S. Application Data

(63) Continuation of application No. 13/928,124, filed on Jun. 26, 2013, now Pat. No. 9,117,723.

(30) Foreign Application Priority Data

Jul. 13, 2012    (KR) .................. 10-2012-0076621

(51) Int. Cl.
*H01L 31/062*    (2012.01)
*H01L 31/113*    (2006.01)
*H01L 27/146*    (2006.01)

(52) U.S. Cl.
CPC ..... *H01L 27/14643* (2013.01); *H01L 27/1463* (2013.01); *H01L 27/14603* (2013.01); *H01L 27/14605* (2013.01); *H01L 27/14609* (2013.01); *H01L 27/14612* (2013.01)

(58) Field of Classification Search
None
See application file for complete search history.

(56) References Cited

U.S. PATENT DOCUMENTS

| | | |
|---|---|---|
| 6,982,186 B2 | 1/2006 | Jeon et al. |
| 7,364,960 B2 | 4/2008 | Lyu |
| 7,397,076 B2 | 7/2008 | Jang |
| 7,535,037 B2 | 5/2009 | Lyu |
| 7,723,140 B2 | 5/2010 | Rhodes |
| 7,749,831 B2 | 7/2010 | Lyu |
| 7,973,342 B2 | 7/2011 | Jeon |
| 8,039,881 B2 | 10/2011 | Mouli |
| 2007/0158771 A1 | 7/2007 | Hynecek |
| 2007/0166865 A1 | 7/2007 | Lee |
| 2010/0044824 A1 | 2/2010 | Hynecek |
| 2010/0200895 A1 | 8/2010 | Lee |

FOREIGN PATENT DOCUMENTS

| | | |
|---|---|---|
| KR | 10-2006-0093385 A | 8/2006 |
| KR | 10-2008-0016067 A | 2/2008 |
| KR | 10-2009-0015652 A | 2/2009 |

*Primary Examiner* — Sonya D McCall Shepard
(74) *Attorney, Agent, or Firm* — Myers Bigel & Sibley, P.A.

(57) ABSTRACT

An image sensor includes a high concentration well region in contact with a device isolation layer extending along a periphery of a photoelectric converting part, which can improve dark current properties of the image sensor. The image sensor also includes a low concentration well region in contact with a sidewall of the device isolation layer overlapped with a transfer gate, which can improve image lag properties of the image sensor. Related fabrication methods are also discussed.

10 Claims, 12 Drawing Sheets

IMAGE SENSORS INCLUDING WELL REGIONS OF DIFFERENT CONCENTRATIONS AND METHODS OF FABRICATING THE SAME

CROSS-REFERENCE TO RELATED APPLICATIONS

This application is a continuation of U.S. patent application Ser. No. 13/928,124 filed Jun. 26, 2013 which claims priority under 35 U.S.C. §119 to Korean Patent Application No. 10-2012-0076621, filed on Jul. 13, 2012, the entireties of which are incorporated by reference herein.

BACKGROUND

The inventive concept relates to image sensors and methods of forming the same.

Image sensors are semiconductor devices that convert an optical image into an electrical signal. The image sensors may be classified into charge coupled device (CCD) type image sensors and a complementary metal oxide semiconductor (CMOS) type image sensors. CIS is an abbreviation for a CMOS type image sensor. The CIS may include two-dimensionally arranged pixels. Each of the pixels includes a photodiode (PD). The photodiode converts incident light into an electrical signal.

SUMMARY

Embodiments of the inventive concept may provide highly integrated image sensors capable of improving a dark current and image lag and methods of fabricating the same.

According to some embodiments, an image sensor may include: a substrate including a plurality of pixel regions; a device isolation layer disposed on the substrate to define active regions in the pixel regions, respectively; a photoelectric converting part formed in the substrate in each of the pixel regions; a transfer gate disposed on the substrate at a side of the photoelectric converting part; a high concentration well region adjacent to the device isolation layer surrounding the photoelectric converting part; and a low concentration well region adjacent to a sidewall of the device isolation layer overlapped with the transfer gate.

In some embodiments, a horizontal distance between the high concentration well region and the sidewall of the device isolation layer overlapped with the transfer gate may be about 0.1 μm or more.

In other embodiments, the substrate, the low concentration well region, and the high concentration well region may be doped with dopants of the same conductivity type.

In still other embodiments, a dopant concentration of the low concentration well region may be greater than that of the substrate and smaller than that of the high concentration well region.

In even other embodiments, the image sensor may further include: a floating diffusion region adjacent to a side of the transfer gate; and a reset gate adjacent to the floating diffusion region and spaced apart from the transfer gate. The low concentration well region may extend to be disposed under the floating diffusion region and the reset gate.

In yet other embodiments, the image sensor may further include: a selection gate and a source follower gate spaced apart from the reset gate. The low concentration well region may further extend to be disposed under the selection gate and the source follower gate.

In yet still other embodiments, the high concentration well region may have a comb-like shape in a plan view.

In further embodiments, the high concentration well region and the low concentration well region may be in contact with a sidewall and a bottom surface of the device isolation layer.

In still further embodiments, a bottom surface of the high concentration well region may be lower than a bottom surface of the photoelectric converting part.

In even further embodiments, the transfer gate may be spaced apart from the high concentration well region in a plan view.

According to other embodiments, a method of forming an image sensor may include: providing a substrate including a plurality of pixel regions; forming a low concentration well region and a high concentration well region adjacent to a boundary between the pixel regions; forming a photoelectric converting part in each of the pixel regions; and forming a transfer gate overlapped with the low concentration well region at a side of the photoelectric converting part.

In some embodiments, the method may further include: forming a device isolation layer electrically isolating the pixel regions from each other. The low concentration well region and the high concentration well region may be formed adjacent to a sidewall and a bottom surface of the device isolation layer.

According to further embodiments, an image sensor includes a substrate having a spaced apart photoelectric conversion region and floating diffusion region therein. The photoelectric conversion region and the floating diffusion region include a first conductivity type. A device isolation region including an insulating material layer is provided in the substrate adjacent a boundary of the photoelectric conversion region. A first well region of a second conductivity type is provided in the substrate extending between the boundary of the photoelectric conversion region and the device isolation region. A second well region of the second conductivity type is provided in the substrate adjacent the floating diffusion region. The second well region has a dopant concentration that is less than that of the first well region.

In some embodiments, the image sensor may further include a gate electrode on a surface of the substrate between the photoelectric conversion region and the floating diffusion region. The second well region may extend under the gate electrode into a channel region in the substrate that is defined between the photoelectric conversion region and the floating diffusion region.

In some embodiments, the device isolation region may include a sidewall adjacent the channel region, and the second well region may extend along the sidewall of the device isolation region.

In some embodiments, the channel region may be free of the first well region.

In some embodiments, a lateral distance between a boundary of the second well region along the sidewall of the device isolation region and a boundary of the first well region adjacent the channel region may be about 0.1 micrometers or more.

In some embodiments, the device isolation region may extend along a periphery of the photoelectric conversion region. The first well region may separate the device isolation region from the photoelectric conversion region along the periphery thereof.

In some embodiments, the first well region may extend along sidewalls and a bottom surface of the device isolation region that are adjacent the periphery of the photoelectric conversion region.

In some embodiments, the first well region may extend from a surface of the substrate to a depth beyond the photoelectric conversion region therein.

In some embodiments, the substrate may be of the second conductivity type. The dopant concentration of the second well region may be greater than that of the substrate.

In some embodiments, the first well region may extend directly between the device isolation layer and the photoelectric conversion region along a periphery thereof. The second well region may extend directly along a sidewall of the device isolation layer in a channel region defined between the photoelectric conversion region and the floating diffusion region.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
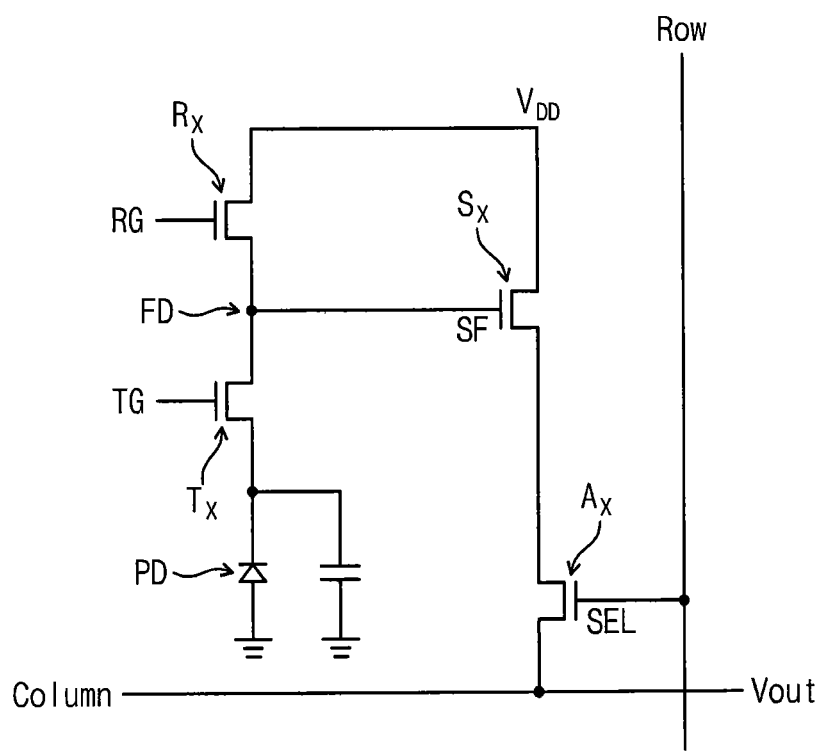
FIG. 1 is a circuit diagram of an image sensor according to some embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIG. 1 is a circuit diagram of an image sensor according to some embodiments of the inventive concept.

Referring to FIG. 1, each of the unit pixels of the image sensor may include a photoelectric conversion region (also referred to herein as a photoelectric converting part) PD, a transfer transistor Tx, a source follower transistor Sx, a reset transistor Rx, and a selection transistor Ax. The transfer transistor Tx, the source follower transistor Sx, the reset transistor Rx, and the selection transistor Ax include a transfer gate TG, a source follower gate SF, a reset gate RG, and a selection gate SEL, respectively. A photoelectric converting part is provided in the photoelectric conversion region PD. The photoelectric converting part PD may be a photodiode including an N-type dopant region and a P-type dopant region. A drain of the transfer transistor Tx may correspond to a floating diffusion region FD. The floating diffusion region FD may also be a source of the reset transistor Rx. The floating diffusion region FD may be electrically connected to the source follower gate SF of the source follower transistor Sx. The source follower transistor Sx is connected to the selection transistor Ax. The reset transistor Rx, the source follower transistor Sx, and the selection transistor Ax may be shared by neighboring pixels. Thus, integration degree of the image sensor may be improved.

A method of operating the image sensor will be described with reference to FIG. 1. A power voltage $V_{DD}$ is applied to the drain of the reset transistor Rx and the drain of the source follower transistor Sx in blocking light, thereby discharging charges remaining in the floating diffusion region FD. Thereafter, the reset transistor Rx is turned-off and then an external light is incident on the photoelectric conversion region PD. Thus, electron-hole pairs are generated in the photoelectric conversion region PD in response to the incident light. The generated holes move into the P-type dopant region. The generated electrons move into the N-type dopant region and are accumulated in the N-type dopant region. If the transfer transistor Tx is turned-on, the charges such as the electrons or the holes are transferred into and then accumulated in the floating diffusion region FD. A gate bias of the source follower transistor Sx is changed in proportion to the quantity of the charges accumulated in the floating diffusion region FD, so that a source potential of the source follower transistor Sx is changed. At this time, if the selection transistor Ax is turned-on through a row line, a signal of the charges is read through a column line.

Figure 2:
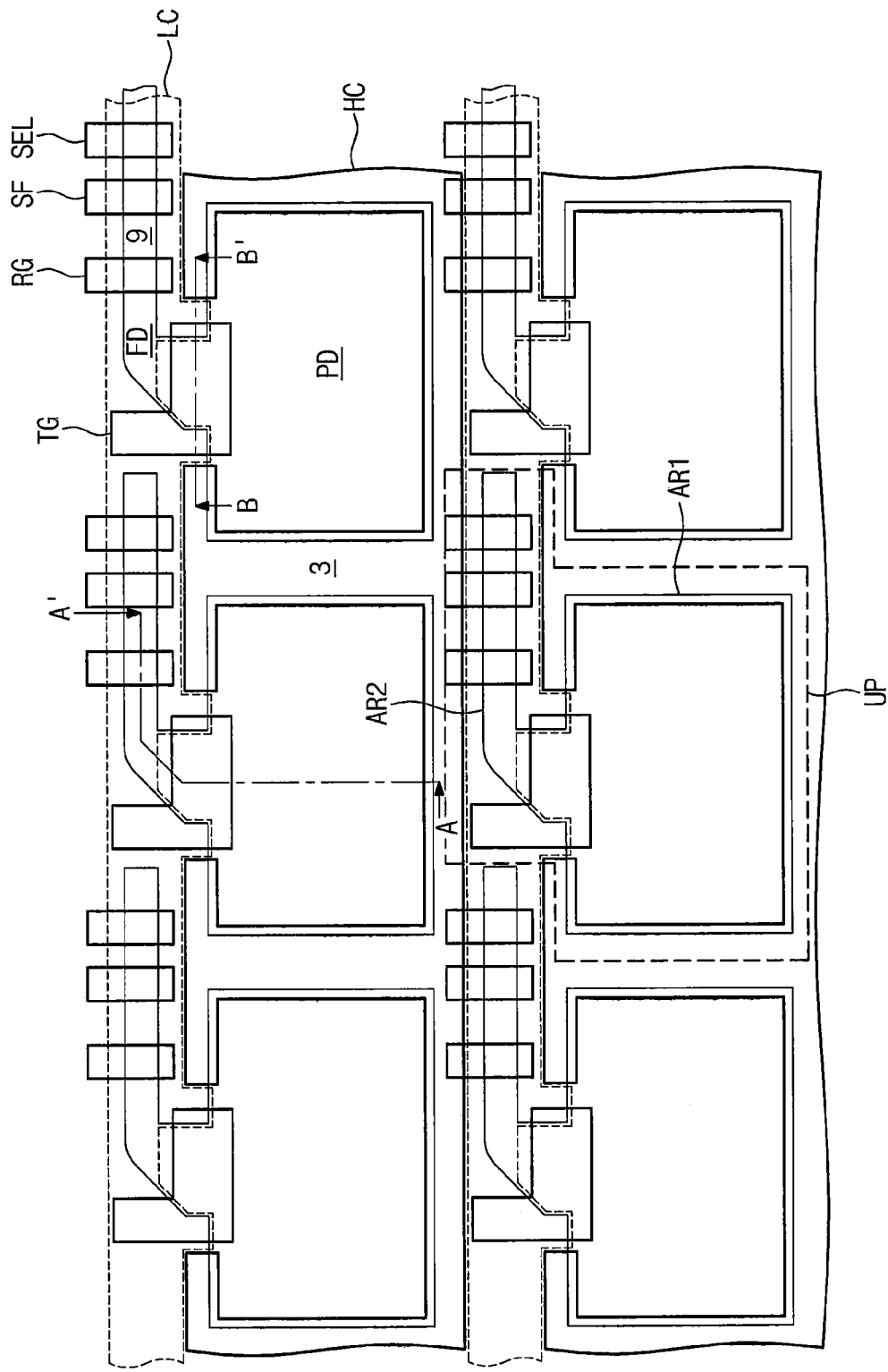
FIG. 2 is a layout of an image sensor according to some embodiments of the inventive concept.
Figure 3A:
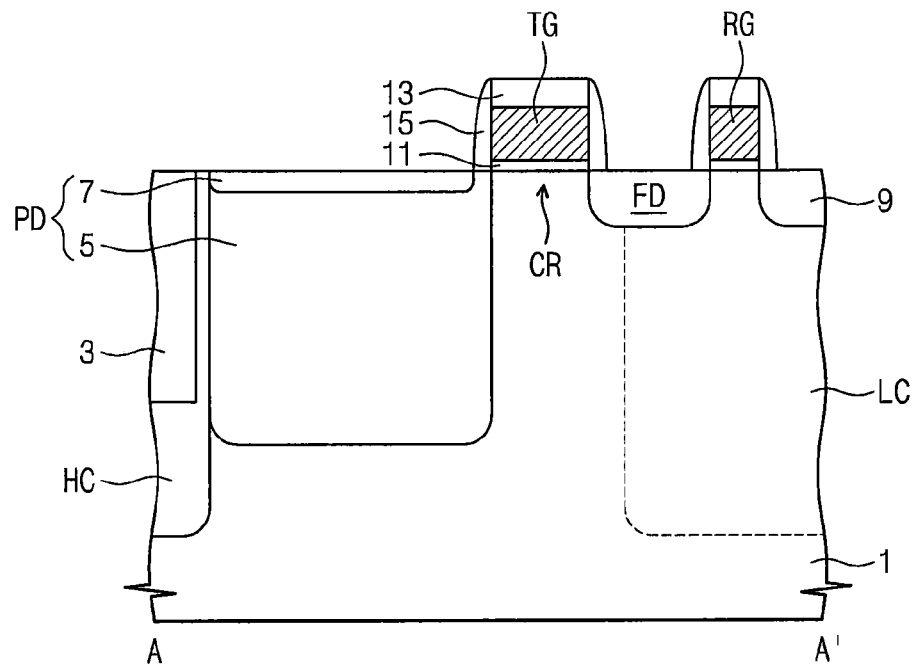
FIGS. 3A and 3B are cross-sectional views taken along lines A-A' and B-B' of FIG. 2, respectively.
Figure 3B:
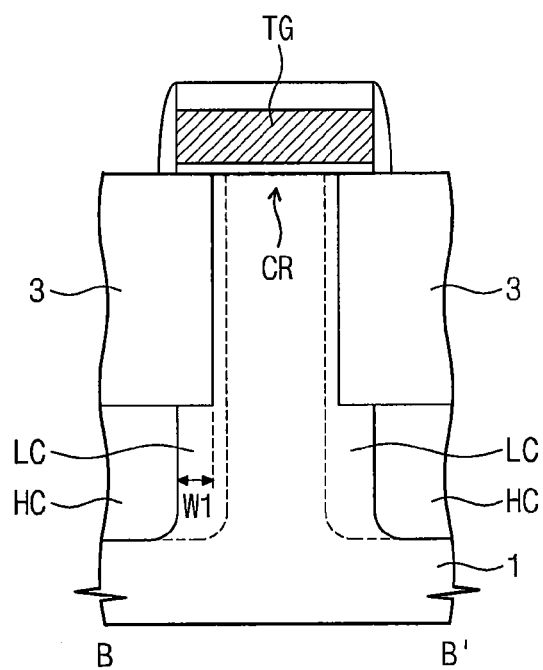

FIG. 2 is a layout of an image sensor according to some embodiments of the inventive concept. FIGS. 3A and 3B are cross-sectional views taken along lines A-A' and B-B' of FIG. 2, respectively.

Referring to FIGS. 2, 3A, and 3B, a substrate 1 includes a plurality of unit pixel regions UP. A device isolation layer 3 is disposed on the substrate 1 to define active regions. Each of the active regions includes a first active region AR1 in which a photoelectric converting part PD is disposed, and a second active region AR2 for operation of transistors Tx, Rx, Sx, and Ax. The first active region AR1 and the second active region AR2 may be disposed in each of the unit pixel regions UP. The substrate 1 may be a silicon substrate, a silicon-on-insulator (SOI) substrate, or a semiconductor epitaxial layer. The device isolation layer 3 may be formed of an insulating material having a refractive index different from that of the substrate 1. For example, the device isolation layer 3 may be formed of at least one of silicon oxide, silicon nitride, and silicon oxynitride. The photoelectric converting part PD is disposed in the substrate 1 in the first active region AR1. The photoelectric converting part PD may be a photodiode including a P-type dopant region 7 and an N-type dopant region 5. A transfer gate TG, a reset gate RG, a source follower gate SF, and a selection gate SEL are disposed on the substrate 1 of the second active region AR2. The gates TG, RG, SF, and SEL are spaced apart from each other. A gate insulating layer 11 is disposed between the substrate 1 and each of the gates TG, RG, SF, and SEL. A capping layer 13 covers a top surface of each of the gates TG, RG, SF, and SEL. A spacer 15 covers a sidewall of each of the gates TG, RG, SF, and SEL.

An area occupied by the first active region AR1 may be greater than an area occupied by the second active region AR2. The transfer gate TG is disposed to be adjacent to a side of the photoelectric converting part PD. The transfer gate TG may be disposed at a border between the first active region AR1 and the second active region AR2. A width of the second active region AR2 under the transfer gate TG is much smaller than that of the first active region AR1. A width of the transfer gate TG may be greater than the width of the second active region AR2 thereunder. The reset gate RG may be disposed to be adjacent to the transfer gate TG. A floating diffusion region FD is disposed in the substrate 1 between the transfer gate TG and the reset gate RG. Source/drain regions 9 are disposed in the substrate 1 adjacent to the reset gate RG, the source follower gate SF, and the selection gate SEL. The floating diffusion region FD and the source/drain regions 9 may be doped with, for example, N-type dopants.

A high concentration well region HC is disposed in the substrate 1 so as to be adjacent to the device isolation layer 3 surrounding the photoelectric converting part PD (i.e., the device isolation layer 3 providing the first active region AR1). The high concentration well region HC is in contact with a sidewall and a bottom surface of the device isolation layer 3 surrounding the photoelectric converting part PD. In other words, the high concentration well region HC may be disposed between the photoelectric converting part PD and the device isolation layer 3. A low concentration well region LC is disposed in the substrate 1 so as to be adjacent to the device isolation layer 3 overlapped with the transfer gate TG. The low concentration well region LC is in contact with a sidewall and a bottom surface of the device isolation layer 3 overlapped with the transfer gate TG. The substrate 1, the low concentration well region LC, and the high concentration well region HC may be doped with dopants of the same conductivity type (e.g., P-type dopants). A dopant concentration of the low concentration well region LC may be greater than that of the substrate 1 and less than that of the high concentration well region HC. A horizontal distance W1 between the high concentration well region HC and the sidewall of the device isolation layer 3 overlapped with the transfer gate TG may be about 0.1 micrometer (μm) or more. The low concentration well region LC may extend to be disposed under the floating diffusion region FD, the reset gate RG, the source follower gate SF, the selection gate SEL, and the source/drain regions 9 adjacent thereto. A bottom surface of the high concentration well region HC may be lower than a bottom surface of the photoelectric converting part PD.

The high concentration well region HC and the low concentration well region LC may function as a potential barrier separating the pixels from each other and prevent cross talk between the pixels. The device isolation layer 3 may be formed by, for example, a shallow trench isolation (STI) technique. At this time, crystal defects may be generated along a surface of the device isolating layer 3 by etching damage. Even though an annealing process is performed, all of the crystal defects may not be cured. Thus, dangling bonds may exist on the surface of the device isolation layer 3. Electrons may be generated by the dangling bonds. The electrons generated by the dangling bonds may flow into the photoelectric converting part PD to deteriorate a dark current property of the image sensor. However, according to embodiments of the inventive concept, P-type dopant ions in the high concentration well region HC surrounding the sidewall and the bottom surface of the device isolation layer 3 can reduce or prevent the electrons generated on the surface of the device isolation layer 3 from flowing into the photoelectric converting part PD. Thus, the dark current property may be improved. Since the high concentration well region HC has a relatively high P-type dopants concentration, the dark current property may be effectively improved.

Figure 4:
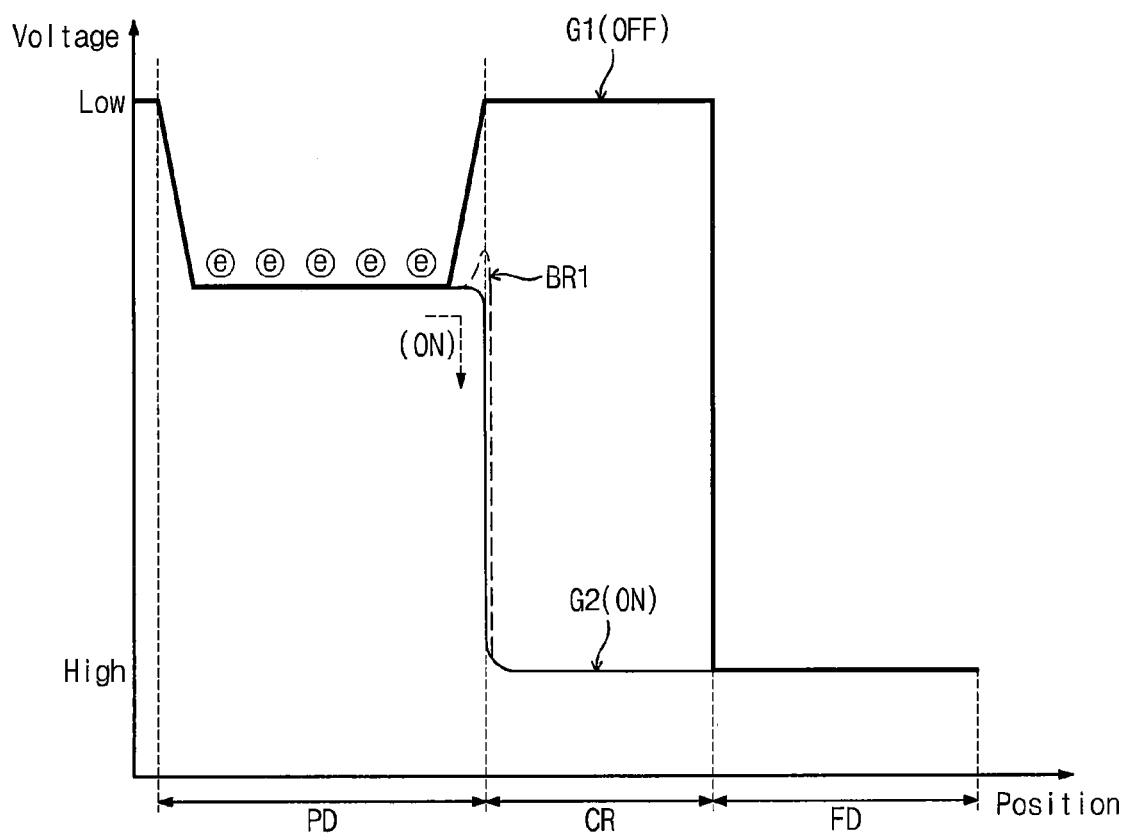
FIG. 4 is a graph showing a potential according to a position in an pixel region.

FIG. 4 is a graph showing a potential according to a position in a pixel region.

Referring to FIGS. 2, 3A, 3B, and 4, when a voltage is not applied to the transfer gate TG (or when the transfer transistor Tx is turned-off), the charges (e) accumulated in the photoelectric converting part PD cannot be transferred into the floating diffusion region FD like a first graph G1. If the voltage is applied to the transfer gate TG (or if the transfer transistor Tx is turned-on), a potential of a channel region CR under the transfer gate TG becomes high, so that the charges accumulated in the photoelectric converting part PD are transferred into the floating diffusion region FD like a second graph G2. At this time, if a concentration of a P-type doped region (e.g., a doped region including P-type dopants) around the channel region CR under the transfer gate TG is high, the P-type doped region may function as a barrier in charge transfer. Thus, an image lag property of the image sensor may be deteriorated. In order to reduce or prevent this, the low concentration well region LC disposed around the channel region CR under the transfer gate TG has the dopant concentration lower than that of the high concentration well region HC.

As a result, according to embodiments of the inventive concept, the high concentration well region HC is disposed to be adjacent to the device isolation layer 3 surrounding the photoelectric converting part PD, so that the dark current property of the image sensor may be improved. Additionally, the low concentration well region LC is disposed to be adjacent to the device isolation layer 3 overlapped with the transfer gate TG, so that the image lag property of the image sensor may be improved.

Even though now shown in the drawings, the gates TG, RG, SF, and SEL may be covered by an interlayer insulating layer, and interconnections may be disposed in the interlayer insulating layer to electrically connect the gates TG, RG, SF, and SEL. A color filter and micro lenses may be disposed on the interlayer insulating layer. Alternatively, the color filter and the micro lenses may be disposed on a bottom surface of the substrate 1.

Figure 5A:
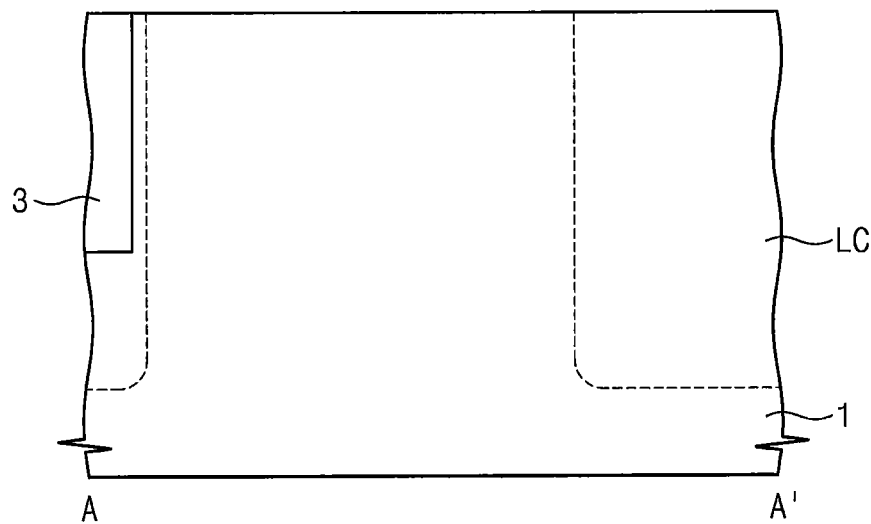
FIGS. 5A and 6A are cross-sectional views illustrating a method of forming an image sensor shown in the cross section of FIG. 3A.
Figure 5B:
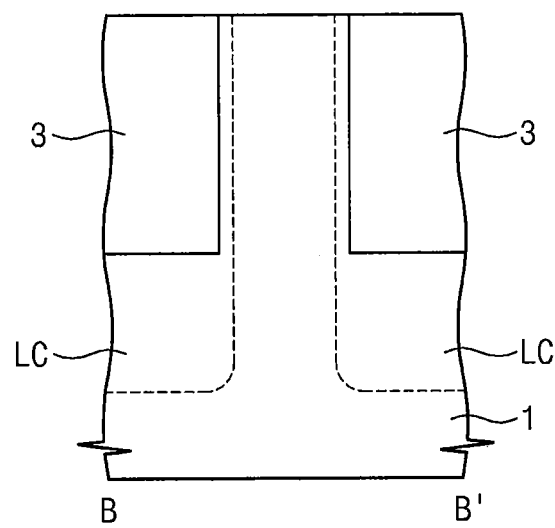
FIGS. 5B and 6B are cross-sectional views illustrating a method of forming an image sensor shown in the cross section of FIG. 3B.
Figure 6A:
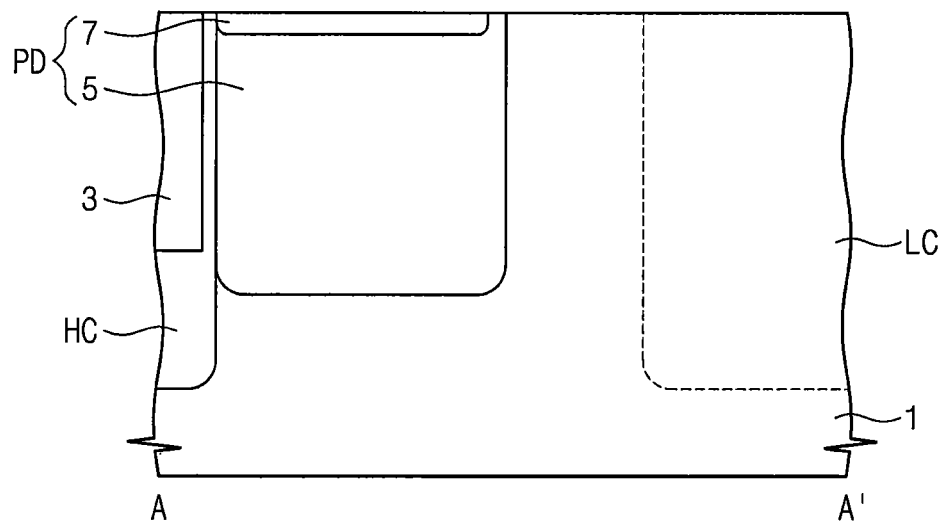
Figure 6B:
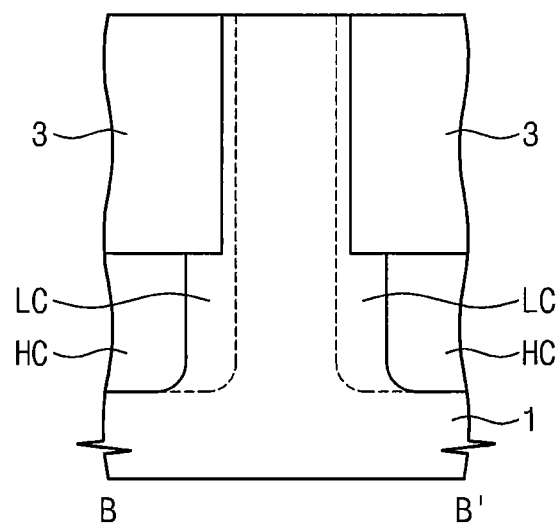

FIGS. 5A and 6A are cross-sectional views illustrating a method of forming an image sensor shown in the cross section of FIG. 3A. FIGS. 5B and 6B are cross-sectional views illustrating a method of forming an image sensor shown in the cross section of FIG. 3B.

Referring to FIGS. 2, 5A, and 5B, a device isolation layer 3 is formed on the substrate 1 to define a first active region AR1 and a second active region AR2. The substrate 1 may be doped with P-type dopants. The device isolation layer 3 may be formed by a STI technique. A first ion implantation process may be performed to form a low concentration well region LC in the substrate 1 around the device isolation layer 3. The first ion implantation process may be performed a plurality of times by changing a projected range (Rp), so that the low concentration well region LC may be formed from a top surface of the substrate 1 to a predetermined depth under or below the device isolation layer 3. For example, the first ion implantation process may implant boron ions into the substrate 1 with a high energy at a tilt angle of about 0 degrees. The low concentration well region LC may be formed to be adjacent to an entire sidewall and an entire bottom surface of the device isolation layer 3. Additionally, the low concentration well region LC may be overlapped with the second active region AR2.

Referring to FIGS. 2, 6A and 6B, a second ion implantation process may be performed to form a high concentration well region HC adjacent to the device isolation layer 3 surrounding the first active region AR1 in which a photoelectric converting part will be formed. The high concentration well region HC may be doped with P-type dopants and have a dopant concentration greater than that of the low concentration well region LC. Similarly to the first ion implantation process, the second ion implantation process may also be performed a plurality of times by changing a projected range (Rp), so that the high concentration well region HC may be formed from the top surface of the substrate 1 to a predetermined depth under or below the device isolation layer 3. And then a plurality of ion implantation processes may be performed to form a P-type dopant region 7 and an N-type dopant region 5 in the substrate 1 of the first active region AR1. Thus, a photoelectric converting part PD including the P-type and N-type dopant regions 7 and 5 may be formed.

Referring to FIGS. 2, 3A, and 3B again, a gate insulating layer 11, a conductive layer, and a capping layer 13 may be sequentially stacked on an entire surface of the substrate 1 and then the capping layer 13, the conductive layer, and the gate insulating layer 11 may be successively patterned to form the transfer gate TG, the reset gate RG, the source follower gate SF, and the selection gate SEL. Spacers 15 may be formed to cover sidewalls of the gates TG, RG, SF, and SEL, respectively. The floating diffusion region FD and the source/drain regions 9 may be formed in the substrate 1 adjacent to the gates TG, RG, SF, and SEL.

The formation order of the well regions LC and HC and the device isolation layer 3 may be changed. In some embodiments, after the low concentration and high concentration well regions LC and HC are formed, the device isolation layer 3 may be formed. In other embodiments, after a trench for the device isolation layer 3 is formed in the substrate 1, the low concentration and high concentration well regions LC and HC may be formed and then the trench may be filled with an insulating material to form the device isolation layer 3. In still other embodiments, after the high concentration well region HC is formed, the low concentration well region LC may be formed.

Figure 7:
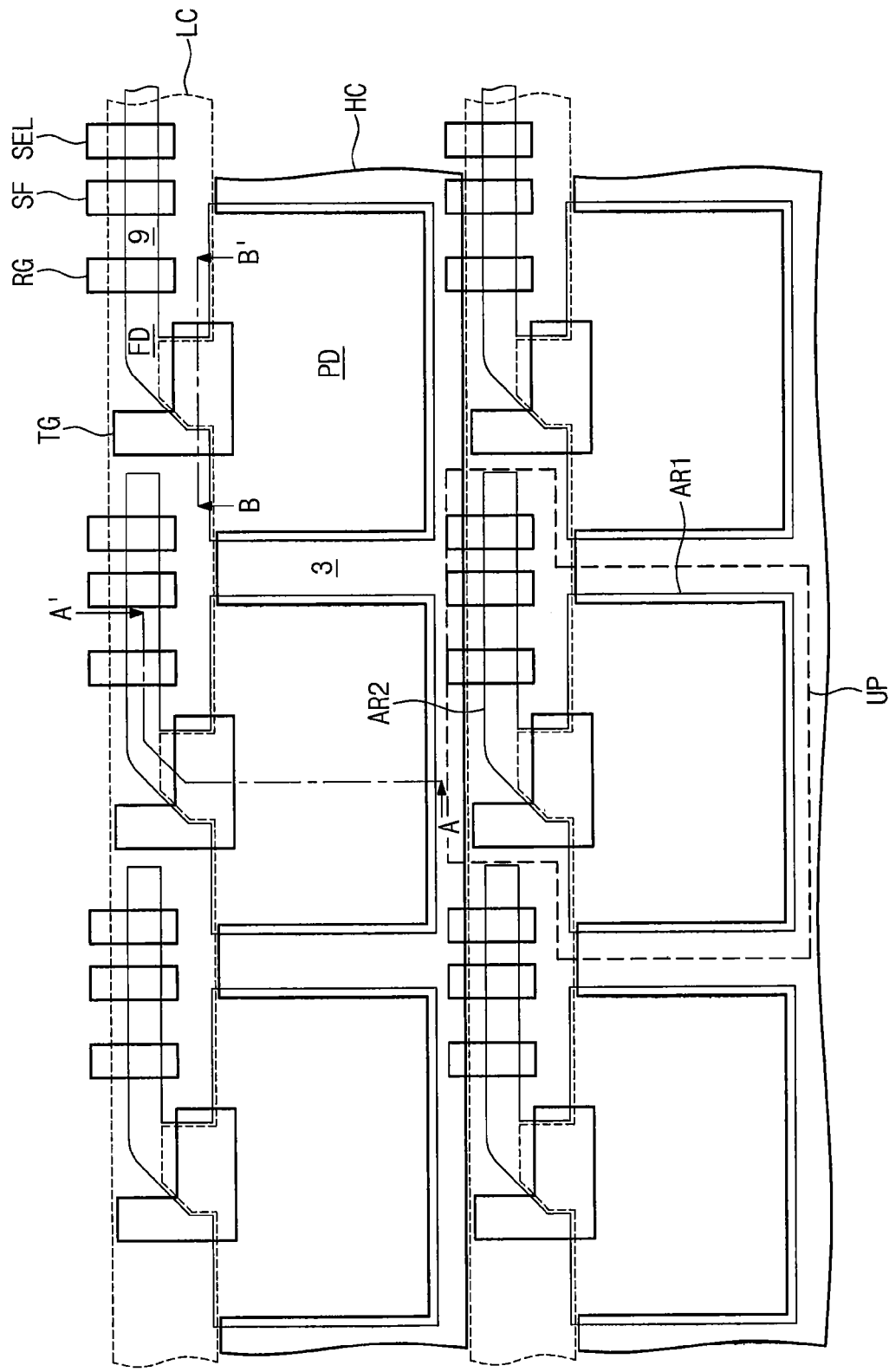
FIG. 7 is a layout of an image sensor according to a modified example of the embodiment illustrated in FIG. 2.
Figure 8:
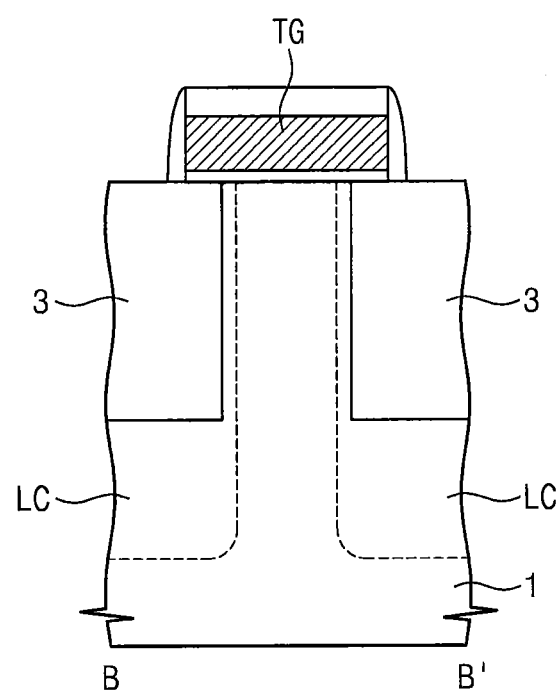
FIG. 8 is a cross-sectional view taken along a line B-B' of FIG. 7.

FIG. 7 is a layout of an image sensor according to a modified example of the embodiment illustrated in FIG. 2. FIG. 8 is a cross-sectional view taken along a line B-B' of FIG. 7. A cross-sectional view taken along a line A-A' of FIG. 7 may be the same as the cross-sectional view of FIG. 3A.

Referring to FIGS. 3A, 7, and 8, a high concentration well region HC may have a comb-like shape surrounding the photoelectric converting part PD in a plan view. The high concentration well region HC may be disposed between the photoelectric converting parts PD adjacent to each other but may not be disposed at a side of the photoelectric converting part PD at which the transfer gate TG is disposed. In other words, a low concentration well region LC is disposed at the side of the photoelectric converting part PD at which the transfer gate TG is disposed. Other elements of the image sensor according to the present modified example may be the same as/similar to the elements described with reference to FIGS. 2, 3A, and 3B corresponding thereto.

Figure 9:
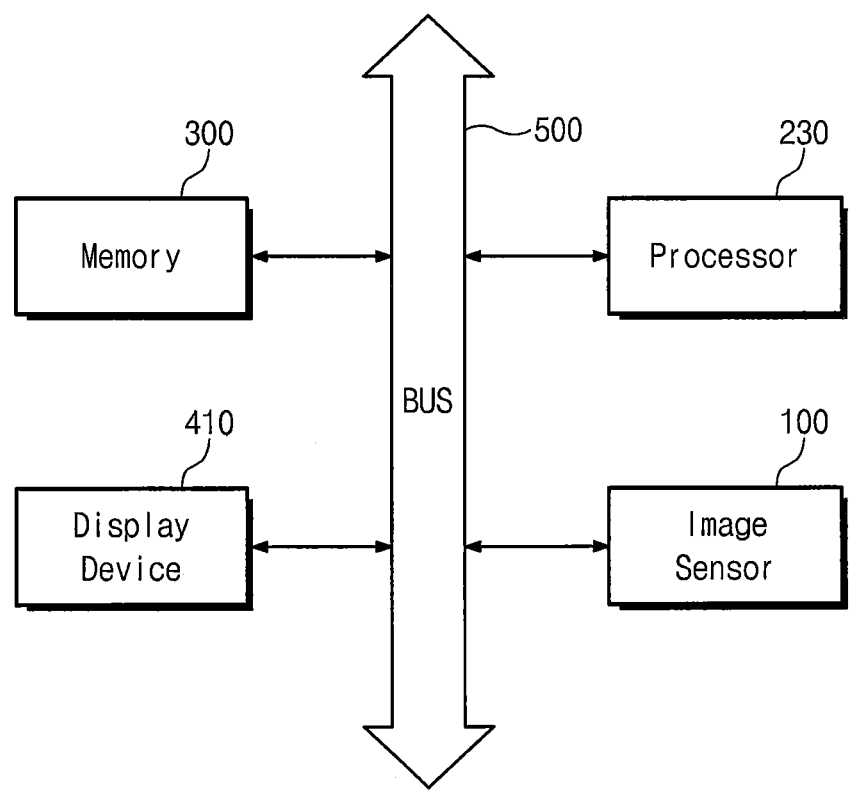
FIG. 9 is a schematic block diagram illustrating an example of electronic devices including image sensors according to embodiments of the inventive concept.

FIG. 9 is a schematic block diagram illustrating an example of electronic devices including image sensors according to embodiments of the inventive concept. The electronic device may be a digital camera or a mobile device. Referring to FIG. 9, a digital camera system may include an image sensor 100, a processor 230, a memory 300, a display 410, and a bus unit 500. The image sensor 100 may be one of the image sensors according to the aforementioned embodiments. As illustrated in FIG. 9, the image sensor 100 may capture the external image data in response to control of the processor 230. The processor 230 may store the captured image data in the memory 300 through the bus unit 500. The processor 230 may output the image data stored in the memory 300 to the display 410.

Figure 10:
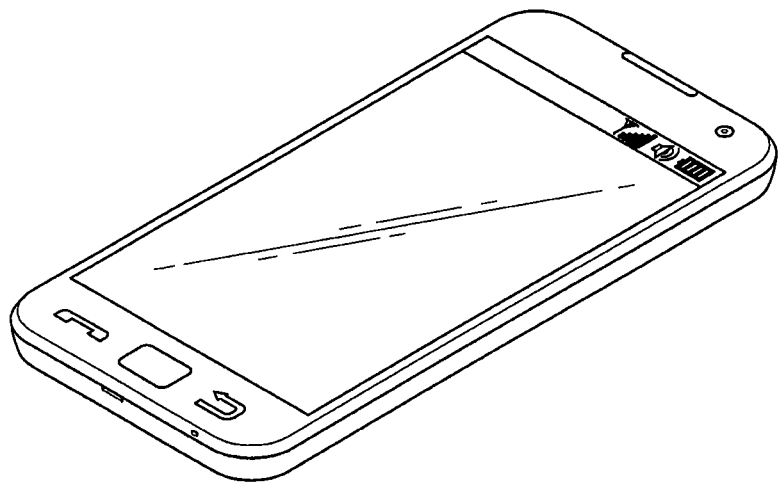
FIGS. 10 to 14 show examples of multimedia devices including image sensors according to embodiments of the inventive concept.
Figure 11:
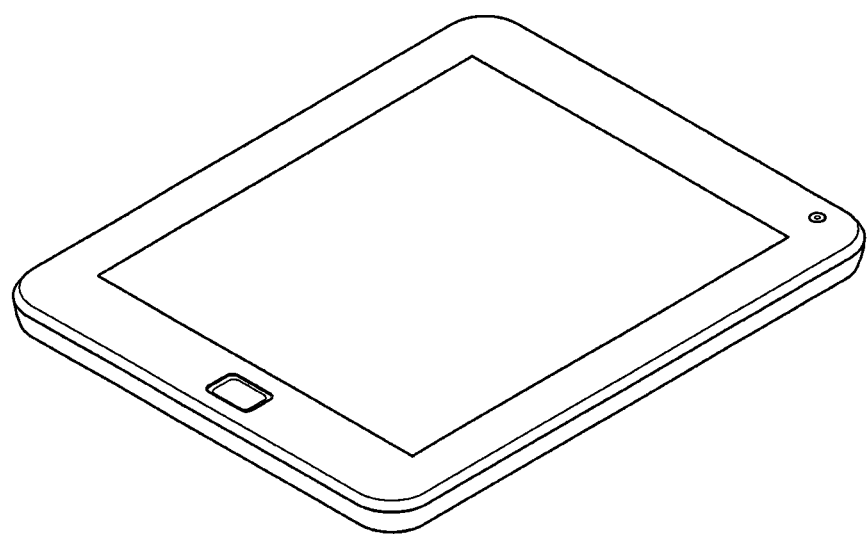
Figure 12:
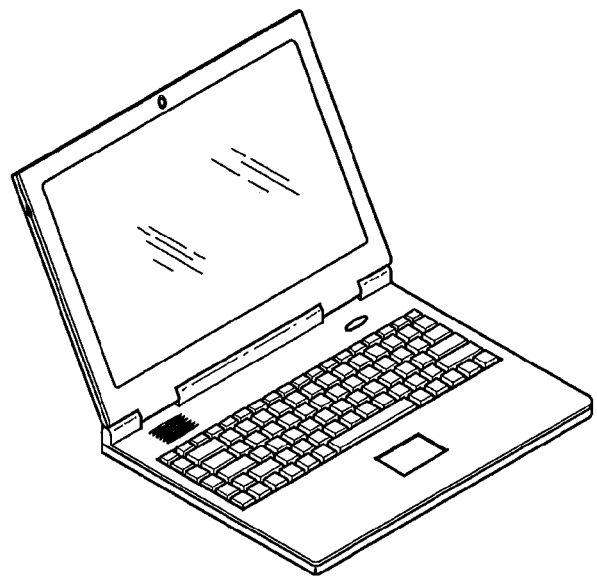
Figure 13:
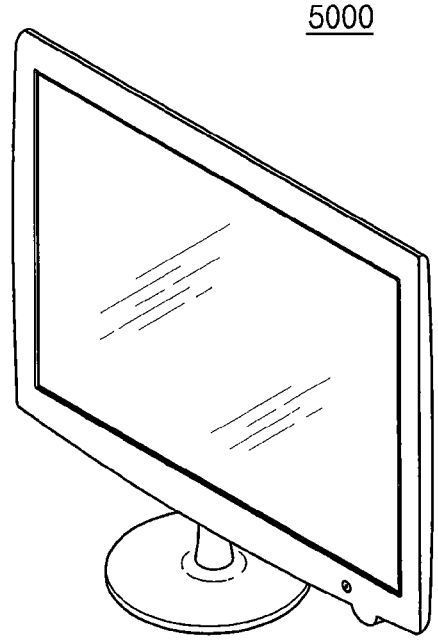
Figure 14:
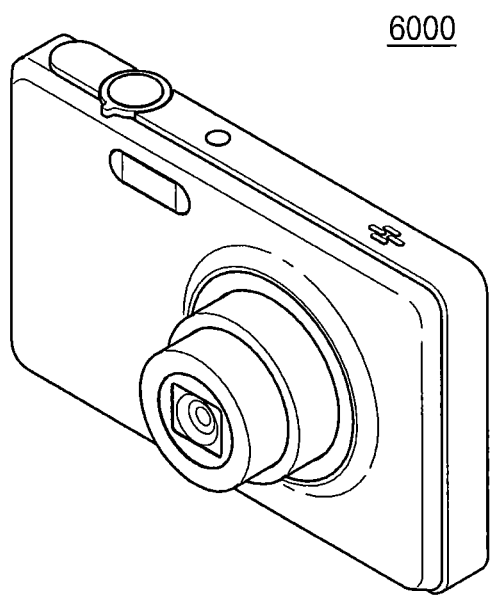

FIGS. 10 to 14 show examples of multimedia devices including image sensors according to embodiments of the inventive concept. The image sensors according to the above embodiments of the inventive concept may be applied to various multimedia devices having image photographing functions. For example, the image sensors in the aforementioned embodiments may be applied to a mobile phone or smart phone 2000 as illustrated in FIG. 10. In other embodiments, the image sensors according to the above embodiments may be applied to a tablet or smart tablet 3000 as illustrated in FIG. 11. In still other embodiments, the image sensors according to the above embodiments may be applied to a notebook computer 4000 of FIG. 12 or a television or smart television 5000 of FIG. 13. In yet other embodiments, the image sensor according to the aforementioned embodiments may be applied to a camera or digital camcorder 6000 of FIG. 14.

Image sensors according to embodiments of the inventive concept include the high concentration well region in contact with the device isolation layer surrounding the photoelectric converting part, which can improve dark current properties. Additionally, the image sensor includes the low concentration well region in contact with the device isolation layer overlapped with the transfer gate, which can improve image lag properties.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. An image sensor, comprising:
   a substrate including a spaced apart photoelectric conversion region and floating diffusion region therein, the photoelectric conversion region and the floating diffusion region comprising a first conductivity type;
   a device isolation region comprising an insulating material layer in the substrate adjacent a boundary of the photoelectric conversion region;
   a first well region of a second conductivity type in the substrate extending between the boundary of the photoelectric conversion region and the device isolation region; and
   a second well region of the second conductivity type in the substrate adjacent the floating diffusion region, the second well region having a dopant concentration less than that of the first well region.

2. The image sensor of claim 1, further comprising:
   a gate electrode on a surface of the substrate between the photoelectric conversion region and the floating diffusion region;
   wherein the second well region extends under the gate electrode into a channel region in the substrate between the photoelectric conversion region and the floating diffusion region.

3. The image sensor of claim 2, wherein the device isolation region includes a sidewall adjacent the channel region, and wherein the second well region extends along the sidewall of the device isolation region.

4. The image sensor of claim 3, wherein the channel region is free of the first well region.

5. The image sensor of claim 4, wherein a lateral distance between the sidewall of the device isolation region and a boundary of the first well region adjacent the channel region is about 0.1 micrometers or more.

6. The image sensor of claim 1, wherein the device isolation region extends along a periphery of the photoelectric conversion region, and wherein the first well region separates the device isolation region from the photoelectric conversion region along the periphery thereof.

7. The image sensor of claim 6, wherein the first well region extends along sidewalls and a bottom surface of the device isolation region adjacent the periphery of the photoelectric conversion region.

8. The image sensor of claim 1, wherein the first well region extends from a surface of the substrate to a depth beyond the photoelectric conversion region therein.

9. The image sensor of claim 1, wherein the substrate comprises the second conductivity type, and wherein the dopant concentration of the second well region is greater than that of the substrate.

10. The image sensor of claim 9, wherein the first well region extends directly between the device isolation layer and the photoelectric conversion region along a periphery thereof, and wherein the second well region extends directly along a sidewall of the device isolation layer in a channel region defined between the photoelectric conversion region and the floating diffusion region.

* * * * *